US006829125B2

United States Patent
Liu et al.

(12) United States Patent
(10) Patent No.: US 6,829,125 B2
(45) Date of Patent: Dec. 7, 2004

(54) ESD PROTECTION CIRCUIT FOR MULTI-POWER AND MIXED-VOLTAGE INTEGRATED CIRCUIT

(75) Inventors: Meng-Huang Liu, Hsinchu (TW); Chun-Hsiang Lai, Taichung (TW); Sing Su, Taipei (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 166 days.

(21) Appl. No.: 09/938,511

(22) Filed: Aug. 27, 2001

(65) Prior Publication Data

US 2003/0039085 A1 Feb. 27, 2003

(51) Int. Cl.[7] .................................................. H02H 9/00
(52) U.S. Cl. .......................................... 361/56; 361/111
(58) Field of Search ........................ 361/56, 111, 91.1, 361/59; 327/310; 257/355, 356

(56) References Cited

U.S. PATENT DOCUMENTS 5,535,086 A * 7/1996 Mentzer ...................... 361/56
6,469,560 B1 * 10/2002 Chang et al. ............... 327/310

* cited by examiner

Primary Examiner—Gregory J. Toatley, Jr.
Assistant Examiner—Boris Benenson
(74) Attorney, Agent, or Firm—Birch, Stewart, Kolasch & Birch, LLP

(57) ABSTRACT

The invention discloses an ESD (Electro Static Discharge) protection circuit, including a resistor device, a capacitor device and a PMOS device. The resistor device is connected in series between a power supply and the capacitor device. The capacitor device is connected in series between the resistor device and the ground. A gate electrode of the PMOS device is connected between the resistor device and the capacitor device. A bulk electrode of the PMOS device is interconnected to a first electrode of the PMOS device, and the first electrode is connected to the power supply. Alternatively, another ESD protection circuit for multiple power supplies includes at least two aforementioned ESD protection circuits, and a common ESD bus. The ESD protection circuits are connected to separate power supplies, and both connected to the common ESD bus. By using the ESD protection circuit, there is no noise between the separate power supplies, and an ESD current could be discharged easily and safely.

7 Claims, 6 Drawing Sheets

ESD PROTECTION CIRCUIT FOR MULTI-POWER AND MIXED-VOLTAGE INTEGRATED CIRCUIT

BACKGROUND OF INVENTION

1. Field of Invention

The invention relates to an ESD protection circuit and, in particular, to an ESD protection circuit for a multi-power and mixed-voltage integrated circuit that can distinguish between a working voltage and an electrostatic voltage by the rise times of each of them.

2. Related Art

Electrostatic protection is an important issue in the study of integrated circuits (IC). The ESD (Electro Static Discharge) protection circuit is used to prevent chips from damage caused by static electricity, which accompanies a large current and a large voltage. Alternatively, many types of ICs are manufactured to include logic functions that operate at different voltage power supply levels. For example, a modern microprocessor chip may include core logic operating at a power supply voltage of 2.5 volts, which interfaces with input/output (I/O) circuitry operating with a 3.3 volts DC power supply. By way of further example, many floppy disk and hard disk controller ICs interface with ISA or EISA busses that require with a 5.0 volts power supply.

In general, separate power in a chip is used to avoid a noise coupling between "dirty" and "clean" busses. However, separate power would induce ESD weakness. For example, FIG. 1 shows a case where I/O power is separate from that of an internal circuit 101. A power supply Vcco is separated from a power supply Vcci, and the ground busses are separated such that a resistance Rsub exists between Vsso and Vssi. If an ESD pulse is applied to the pin 102 with respect to the power supply Vcci, the ESD current may discharge through path 103. The path 103 is the desired current path of the ESD current. However, the resistance Rsub might be large enough to introduce a large IR voltage drop, resulting in a large voltage difference between the pin 102 and the power supply Vcci. When the voltage difference is too large, part of the internal circuit 101 is overstressed and then damaged, that is, an unexpected path 104 is initiated to discharge ESD current.

As shown in FIG. 2, an ESD protection circuit 205 is provided to connect the power supply Vcco and the power supply Vcci. The ESD current can be discharged easily through the parasitic diode D1 and the ESD protection circuit 205 for the power supply Vcci, that is, the path 203. In this case, the ESD current also could be discharged through path 204 to discharge the ESD current from a pin 202 to the power supply Vcci. An internal circuit 201 would not be damaged and could be protected safely. Thus, the ESD protection circuits 205 between separate power supply are very important to protect the internal circuit 201.

In prior art, a back-to-back diode is used to serve as this kind of ESD protection circuit, as shown in FIG. 3. The number of back-to-back diode depends on the requirement of noise immunity and the voltage difference between a power supply Vcc1 and a power supply Vcc2. For example, while the nominal power supply Vcc1 is the same as the power supply Vcc2 and the power supply Vcc1 is expected to be noisier than the power supply Vcc2, the number of back-to-back diode in the direction of the power supply Vcc1 to the power supply Vcc2 could be increased to enhance the noise immunity. However, the increased diode number would degrade the protection efficiency of the ESD protection circuit. Furthermore, while the power supply Vcc1 is larger than the power supply Vcc2, the voltage drop of the diode string in the direction of the power supply Vcc1 to the power supply Vcc2 have to be larger than the voltage drop between the power supply Vcc1 and the power supply Vcc2. For example at least 4 diodes (D1~D4), as shown in FIG. 3, have to compensate for a difference of 5 volts and 3.3 volts in the supply voltage.

As described above, a large number of diodes may be required in order to prevent the noise coupling between the different power supplies and would degrade the protection efficiency. In addition, this kind of ESD protection circuit has a potential circuit problem due to the power sequence dependent property as described below.

Nowadays, an IC may require many different power supplies, each being for one of a plurality of internal circuits and each being capable of independent operation. To save power, each of these internal circuits may be independently turned off and turned on based upon dynamically changing operational requirements. This power sequencing raises design problems. As one example, as shown in FIG. 2, during power saving modes, when the power supply Vcci is deactivated independently for power saving, the power from the energized power supply Vcco will flow to the un-energized power supply Vcci through the ESD protection circuits 205 such as those in FIG. 3. The energizing of power supply Vcci is also undesired. Thus, if power sequencing is violated, current may flow from an energized rail to an un-energized rail causing a short or defeating the purpose of an energy saving mode.

From the above description, how to provide an ESD protection circuit for separating power supply and to overcome the noise between power supplies is currently an important subject.

SUMMARY OF THE INVENTION

Pursuant to the above problems, it is an objective of the invention to provide an ESD protection circuit, which is used for an IC with multi-power and mixed-voltage.

It is also another objective of the invention to provide an ESD protection circuit, which can lower the noise coupling and increase the protection efficiency.

To achieve the above objective, in one aspect, the circuit according to the invention includes a resistor device, a capacitor device, and a PMOS device. The resistor device is in series and connected between a power supply and the capacitor device. The capacitor device is connected in series between the resistor device and the ground. The PMOS device includes a gate electrode, a first electrode, a second electrode, and a bulk electrode. The gate electrode is connected between the resistor device and the capacitor device. The bulk electrode is interconnected to the first electrode, and the first electrode is connected to the power supply.

Generally, the ESD voltage is far larger than the normal power-on voltage, and the rise time of the ESD pulse and the rise time of the normal power-on pulse are, respectively, in nanosecond order and in millisecond order. As described above, a RC time constant of a RC circuit composed of the resistor device and the capacitor device is from 0.1 to 10 microseconds. Thus, the RC circuit could distinguish the ESD voltage and the normal power-on voltage. During a normal power-on event, the RC circuit could couple with the rise time of the normal power-on voltage pulse synchronously. However, during an ESD event, the RC circuit would be delayed so that the RC circuit could not couple with the rise time of the ESD voltage pulse synchronously. Due to the difference of the rise time, the RC circuit could control the on/off of the PMOS device. Therefore, the ESD protection circuit according to the invention is on in the ESD event to discharge ESD, and is off in the normal power-on event to prevent the current from flowing through the ESD protection circuit.

In another aspect of the invention, the circuit, which is carried out in a semiconductor device with multiple power supplies, includes at least two ESD protection circuits, and a common ESD bus. The resistor devices and the first electrodes of the ESD protection circuits are connected to at least two separate corresponding power supplies, respectively. The second electrodes of the ESD protection circuits are connected to the common ESD bus, respectively. The common ESD bus surrounds the whole semiconductor device and serves as the common connection among separate power supplies.

As described above, the current could not flow through the ESD protection circuits in a normal power-on event, so the noise between separate power supplies will not occurr. Alternatively, the current could flow through one of the ESD protection circuits and the common ESD bus to another one of the ESD protection circuits in an ESD event. Because the ESD protection circuits have a parasitic bipolar effect, the ESD protection circuits serve as forward-biased parasitic diodes, and the ESD current will flow from the common ESD bus through the ESD protection circuits easily so that the ESD voltage will be discharged.

BRIEF DESCRIPTION OF THE DRAWINGS

The invention will become more fully understood from the detailed description given in the herein below illustration only, and thus are not limitative of the invention, and wherein.

DETAILED DESCRIPTION OF THE INVENTION

The invention will be apparent from the following detailed description, which proceeds with reference to the accompanying drawings, wherein the same references relate to the same elements.

Figure 1:
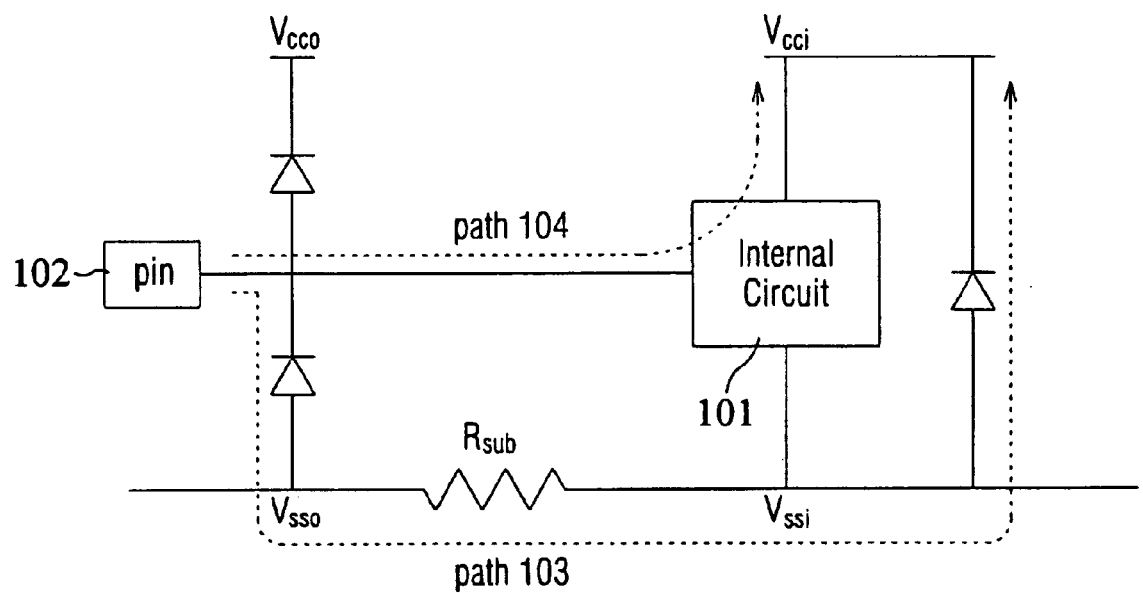
FIG. 1 is a circuit diagram showing a circuit having separate power supplies.
Figure 2:
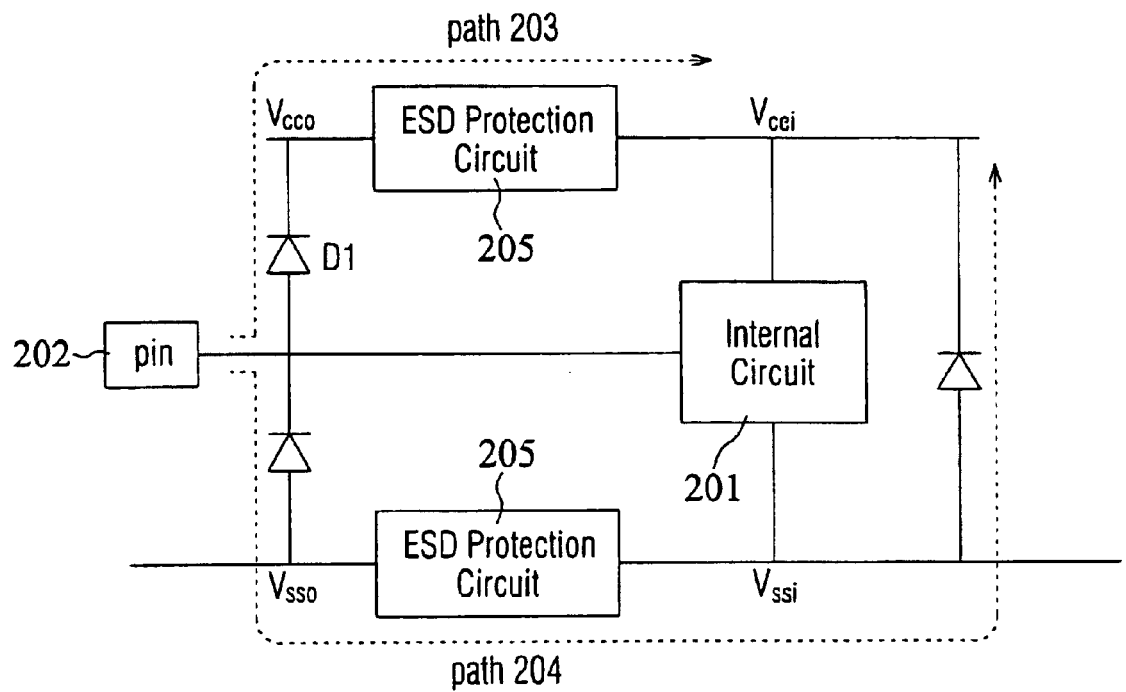
FIG. 2 is a circuit diagram showing a circuit having separate power supplies and conventional ESD protection circuits.
Figure 3:
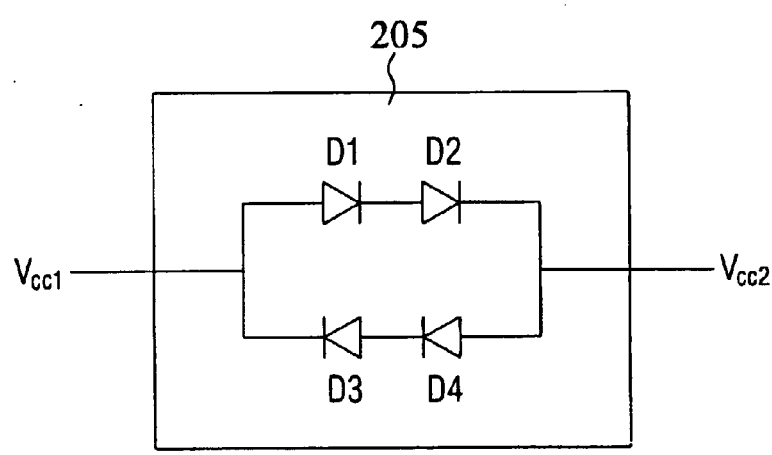
FIG. 3 is a schematic view showing the details of a conventional ESD protection circuit.
Figure 4:
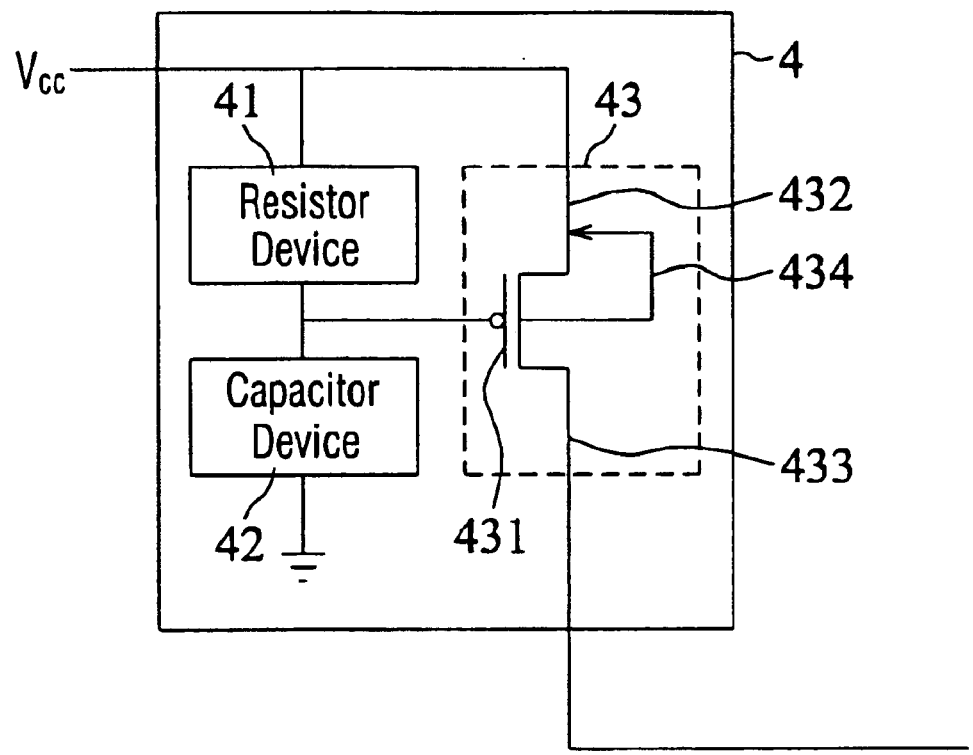
FIG. 4 is a circuit diagram showing an ESD protection circuit of one embodiment according to the invention.

With reference to FIG. 4, in one embodiment according to the invention, the ESD protection circuit 4 comprises a resistor device 41, a capacitor device 42, and a PMOS device 43. In this embodiment, the resistor device 41 is connected in series between a power supply Vcc and the capacitor device 42. The capacitor device 42 is connected in series between the resistor device 41 and the ground GND. The PMOS device 43 includes a gate electrode 431, a first electrode 432, a second electrode 433, and a bulk electrode 434. The gate electrode 431 is connected to where between the resistor device 41 and the capacitor device 42. The bulk electrode 434 is interconnected to the first electrode 432, and the first electrode 432 is connected to the power supply Vcc.

Figure 5:
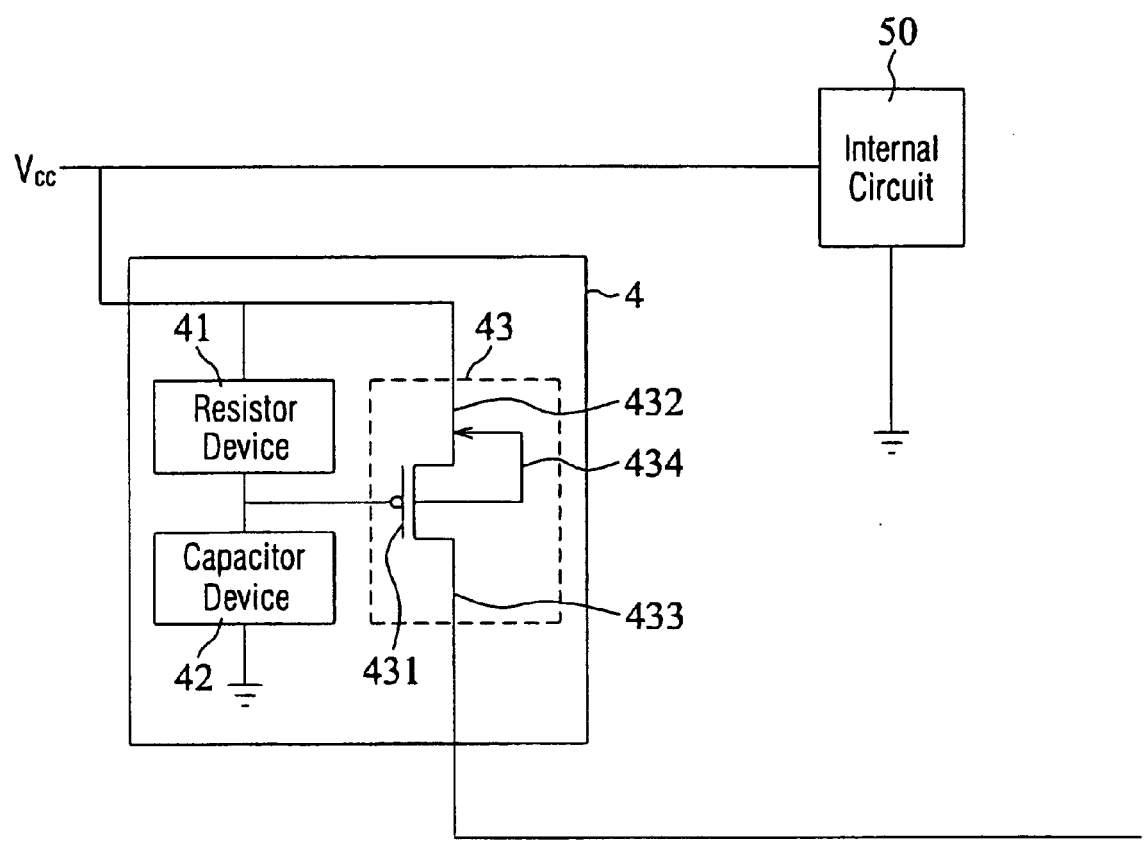
FIG. 5 is a circuit diagram showing a circuit having one ESD protection circuit of one embodiment according to the invention.

As described above, in the circuit 4 of one embodiment according to the invention, the resistor device 41 and the capacitor device 42 forms the RC circuit, and the RC circuit is substantially between 0.1 $\mu$s and 10 $\mu$s. As shown in FIG. 5, due to the order of the rise time of the normal power-on pulse is millisecond, the first electrode 432 and the gate 431 have equivalent voltages equal to the normal power-on voltage. Therefore, the PMOS 43 turns off so that the normal power-on voltage flows through the internal circuit 50 and the internal circuit 50 is in normal operation. On the other hand, due to the fact that the rise time of the ESD pulse is a nanosecond, the voltage of the gate 431 is delayed so that the first electrode 432 has a higher voltage than the gate 431. Therefore, the PMOS 43 turns on so that the ESD voltage flows through the ESD protection circuit 4 and is discharged safely. As described above, the internal circuit 50 is prevented from being damaged by the ESD voltage.

Figure 6:
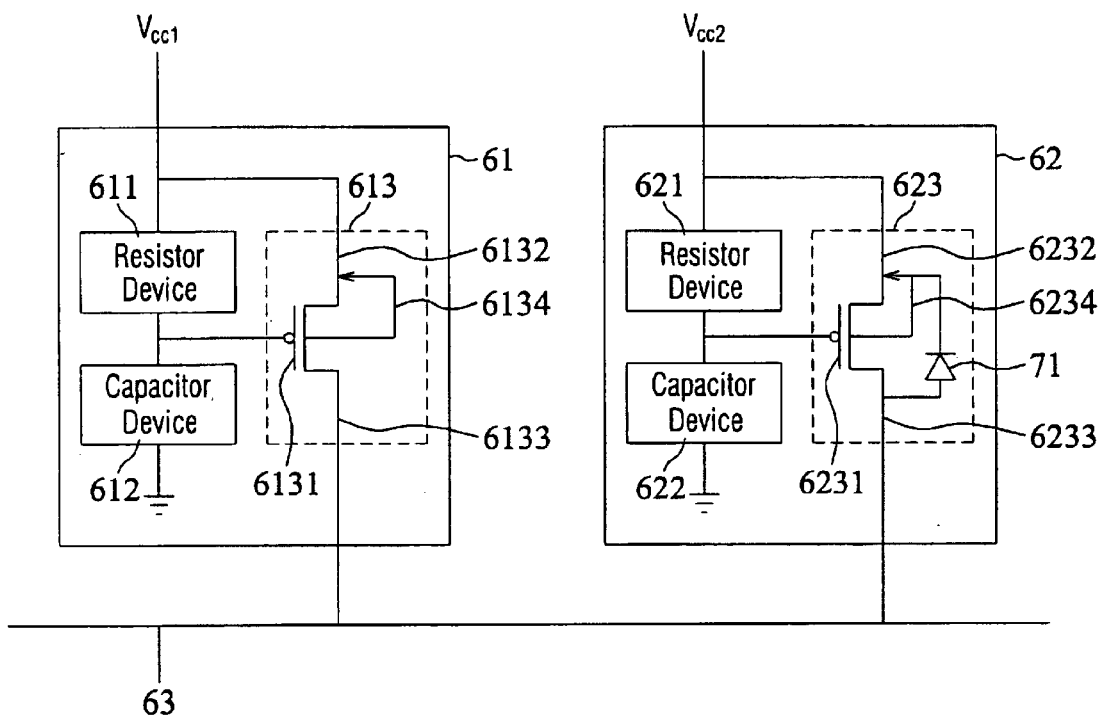
FIG. 6 is a circuit diagram showing a circuit having separate power supplies and ESD protection circuits of one embodiment according to the invention.

As referred to FIG. 6, in another embodiment according to the invention, an ESD protection circuit 6 for multiple power supplies is implemented in a semiconductor device with multiple power supplies, and includes a first ESD protection circuit 61, a second ESD protection circuit 62, and a common ESD bus 63. In this case, the first ESD protection circuit 61 includes a resistor device 611, a capacitor device 612, and a PMOS device 613. The second ESD protection circuit 62 includes a resistor device 621, a capacitor device 622, and a PMOS device 623. The common ESD bus 63 is provided surrounding the semiconductor device. The first ESD protection circuit 61 and the second ESD protection circuit 62 have the same structure as the ESD protection circuit 4 mentioned above. In this embodiment, the PMOS device 613 has a gate electrode 6131, a first electrode 6132, a second electrode 6133, and a bulk electrode 6134, the PMOS device 623 has a gate electrode 6231, a first electrode 6232, a second electrode 6233, and a bulk electrode 6234. The first electrode 6132 and the resistor device 611 of the first ESD protection circuit 61 are connected to a first power supply Vcc1, and the first electrode 6232 and the resistor device 621 of the second ESD protection circuit 62 are connected to a second power supply Vcc2. Further, the second electrode 6133 and the second electrode 6233 are connected to the common ESD bus 63.

As described above, when the first power supply Vcc1 and the second power supply Vcc2 are both on normal power-on voltage, for example, the PMOS device 613 and the PMOS device 623 are turn off. Consequently, it does not matter that the first power supply Vcc1 is greater than, less than, or equal to the second power supply Vcc2; the first power supply Vcc1 and the second power supply Vcc2 will not affect each other, so there is no noise between the first power supply Vcc1 and the second power supply Vcc2.

Figure 7:
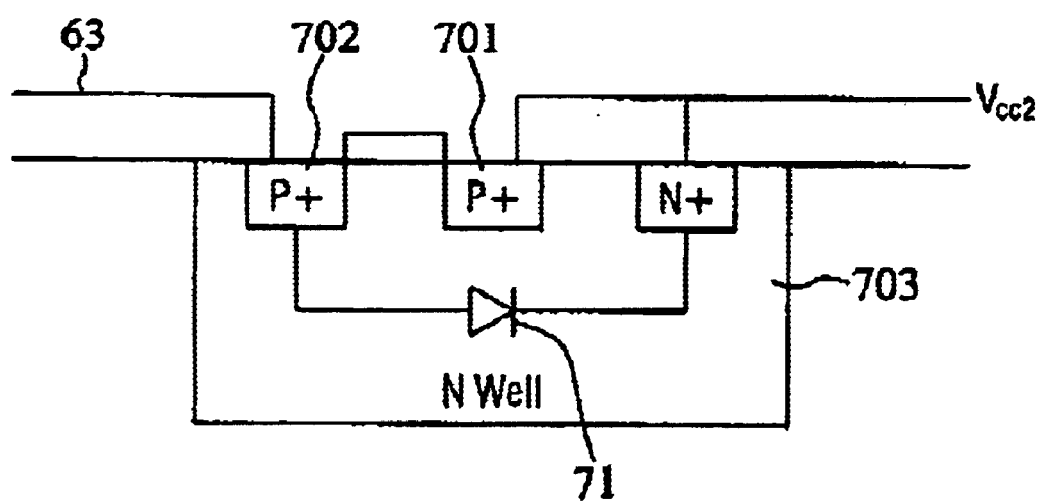
FIG. 7 is a cross section diagram showing a parasitic diode in the PMOS device of one embodiment according to the invention.

Alternatively, when the first power supply Vcc1 is an ESD voltage, as mentioned above, the PMOS device 613 turns on, so that the ESD current flows through the first ESD protection circuit 61 to the common ESD bus 63. The ESD current, then, flows through the common ESD bus 63 to the second electrode 6233 of the PMOS device 623 in the second ESD protection circuit 62. In addition, because the bulk electrode 6234 of the PMOS device 623 is connected to the first electrode 6232, a parasitic diode 71 of the PMOS device 623 is forward-biased in the direction from the second electrode 6233 to the first electrode 6232. In more detail, as shown in FIG. 7, the first electrode 6232 is a P+ diffusion region 701, the second electrode 6233 is a P+ diffusion region 702, and the bulk electrode 6234 is a N-well region 703. The parasitic diode 71 conducts the ESD current towards Vcc2. This occurs even if the PMOS device 623 does not turn on in time, and the parasitic diode 71 can conduct ESD current. In this way, the ESD current can flow from Vcc1 to Vcc2. In other words, the PMOS device 613 and the parasitic diode 71 will discharge the ESD current from Vcc1 to Vcc2.

Similarly, when the second power supply Vcc2 is an ESD voltage, the ESD current flows through the second ESD protection circuit 62, the common ESD bus 63, and the first ESD protection circuit 61, and is discharged from the first ESD protection circuit 61.

Moreover, the ESD protection circuit 6 for multiple power supplies of one embodiment according to the invention could further include a third ESD protection circuit. Accordingly, the ESD current could flow through the second ESD protection circuit 62 or the first ESD protection circuit 61, the common ESD bus 63, and the third ESD protection circuit, and is discharged from the third ESD protection circuit.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An ESD (Electro Static Discharge) protection circuit, comprising:
    a resistor device, wherein one end of the resister device is connected to a power supply;
    a capacitor device, which is connected in series between the resistor device and ground; and
    a PMOS device, which comprises a gate electrode, a first electrode, a second electrode and a bulk electrode, wherein the gate electrode is connected between the resistor device and the capacitor device, the bulk electrode is interconnected to the first electrode, and the first electrode is connected directly to the power supply.

2. The ESD protection circuit as claimed in claim 1, wherein the resistor device and the capacitor device form a RC circuit, and the rise time of the RC circuit is substantially between 0.1 $\mu$s and 10 $\mu$s.

3. An ESD protection circuit for multiple power supplies, comprising:
    at least two ESD protection circuits, wherein each of the ESD protection circuits comprises:
        a resistor device, wherein one end of the resistor device is connected to a power supply,
        a capacitor device, which is connected in series between the resistor device and ground,
        a PMOS device, which comprises a gate electrode, a first electrode, a second electrode and a bulk electrode, wherein the gate electrode is connected between the resistor device and the capacitor device, the bulk electrode is interconnected to the first electrode, and the first electrode is connected directly to the power supply, and
        each of the ESD protection circuits is connected to one of the multiple power supplies; and
    a common ESD bus, wherein the second electrodes are connected to the common ESD bus.

4. The ESD protection circuit for multiple power supplies as claimed in claim 3, wherein the resister device and the capacitor device in each of the ESD protection circuits form a RC circuit, and the rise time of the RC circuit is substantially between 0.1 $\mu$s and 10 $\mu$s.

5. The ESD protection circuit for multiple power supplies as claimed in claim 3, wherein the voltages of the multiple power supplies are equal to each other.

6. The ESD protection circuit for multiple power supplies as claimed in claim 3, wherein the voltages of the multiple power supplies are not equal.

7. The ESD protection circuit or multiple power supplies as claimed in claim 3, wherein here is no current flowing through the common ESD bus when the circuit is normally operated.

* * * * *